United States Patent
Arnold et al.

(10) Patent No.: US 7,852,081 B2
(45) Date of Patent: Dec. 14, 2010

(54) METHOD AND CONTROL DEVICE FOR POSITION DETERMINATION OF ACQUISITION DEVICES FOR A MAGNETIC RESONANCE SYSTEM

(75) Inventors: Thomas Arnold, Nürnberg (DE); Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 297 days.

(21) Appl. No.: 12/039,125

(22) Filed: Feb. 28, 2008

(65) Prior Publication Data

US 2008/0211503 A1 Sep. 4, 2008

(30) Foreign Application Priority Data

Mar. 1, 2007 (DE) ................. 10 2007 010 047

(51) Int. Cl.
*G01V 3/00* (2006.01)
(52) U.S. Cl. .................................... 324/318; 324/322
(58) Field of Classification Search ................. 324/318, 324/322

See application file for complete search history.

(56) References Cited

U.S. PATENT DOCUMENTS

| | | | | |
|---|---|---|---|---|
| 6,661,227 B2 * | 12/2003 | Eggers et al. | ............... | 324/307 |
| 7,141,976 B2 | 11/2006 | Campagna | | |
| 7,145,338 B2 * | 12/2006 | Campagna et al. | .......... | 324/318 |
| 7,598,737 B2 * | 10/2009 | Campagna | .................. | 324/307 |
| 2007/0103157 A1 | 5/2007 | Campagna | | |

* cited by examiner

*Primary Examiner*—Louis M Arana
(74) *Attorney, Agent, or Firm*—Schiff Hardin LLP

(57) ABSTRACT

In a method and a corresponding control device for automatic position determination in at least one spatial direction of at least two acquisition devices, wherein more acquisition devices than acquisition channels are present, a position measurement for one of the acquisition devices is implemented with an acquisition channel in a first step and a position measurement for another of the acquisition devices with the same acquisition channel is implemented in a second step. The position of the respective acquisition devices is determined based on these position measurements.

32 Claims, 4 Drawing Sheets

METHOD AND CONTROL DEVICE FOR POSITION DETERMINATION OF ACQUISITION DEVICES FOR A MAGNETIC RESONANCE SYSTEM

BACKGROUND OF THE INVENTION

1. Field of the Invention

The present invention concerns a method for automatic position determination in at least one spatial direction of acquisition devices (in particular local coils) that are movable move relative to a magnetic resonance tomography scanner. The invention also concerns a corresponding control device, a magnetic resonance system and a computer program product and an electronically readable data medium.

2. Description of the Prior Art

Modern magnetic resonance systems normally operate with a number of different antennas (also called coils herein) for emission of radio-frequency pulses for nuclear magnetic resonance excitation and/or for acquisition of the excited magnetic resonance signals. A magnetic resonance system normally has a larger whole-body coil (body coil) permanently installed in the apparatus. The whole-body coil is typically arranged cylindrically around the patient acceptance space (for example with a structure known as a birdcage structure) in which the patient is supported on a recumbent panel or table during a measurement. Furthermore, one or more acquisition devices (i.e. small coils or called local coils or surface coils) are frequently used in a tomography apparatus. The local coils serve to acquire detailed images of body parts or organs of a patient that are located relatively near to the body surface. For this purpose the local coils are applied directly at the location of the patient at which the region to be examined is located. In the use of such local coils transmission occurs with the whole-body coil (as a transmission coil) and the excited magnetic resonance signals are acquired with the local coils (as acquisition coils).

For a magnetic resonance examination it is important to know the exact position of the employed local coils relative to the patient support (and thus relative to the patient). In principle it is possible to manually measure the position of the coils with the aid of rulers, scales, markings, etc. on the patient support when it is moved out from the magnetic resonance system. Particularly when a number of local coils are used or when coil arrays composed of multiple coils are used, such a measurement is very complicated and additionally entails the risk that the measured positions are associated with the wrong coils. It is therefore simpler and safer to automatically determine the position of the local coils in the framework of a magnetic resonance measurement.

However, one acquisition channel of the magnetic resonance system per local coil is required in order to automatically determine the position of the local coils in the framework of a magnetic resonance measurement. Since the number of the acquisition channels is limited for cost reasons, the number of the local coils to be measured frequently exceeds the number of the acquisition channels.

SUMMARY OF THE INVENTION

An object of the present invention is to provide the position of the local coils automatically via a magnetic resonance measurement even when the number of the acquisition channels is smaller than the number of the local coils to be measured.

The above object is achieved in accordance with the present invention by a method for automatic position determination in at least one spatial direction of at least two acquisition devices wherein the acquisition devices (in particular local coils) move relative to a magnetic resonance tomography scanner such that a position of the acquisition devices relative to one another remains essentially constant. For example, all acquisition devices can be arranged on or at a patient support on which a patient to be examined with the acquisition devices is also located. In other words, a distance or separation between two of the acquisition devices remains constant during the automatic position determination. The inventive method thereby operates with one or more acquisition channels. During a position measurement with regard to one of the acquisition devices, the method needs only one acquisition channel. In the event that more acquisition devices than acquisition channels are present, in a first step the method uses a specific acquisition channel for position measurement for one of the acquisition devices. In a second step (which immediately follows the first step), the same acquisition channel is used in order to implement a position measurement for another of the acquisition devices. Finally, the position of the respective acquisition devices id determined dependent on the implemented position measurements.

Because the same acquisition channel is used in the inventive method in order to implement position measurements for a number of acquisition devices, the position of all acquisition devices can also be determined when the number of the acquisition devices exceeds the number of the acquisition channels. For example, it is possible to detect the positions of all acquisition devices with only one pass of the patient support through the magnetic resonance tomography scanner, by each acquisition device being coupled at least once with one of the acquisition channels for position measurement during this pass, wherein no manual interventions (for example unplugging and re-plugging of the connection between acquisition channel and acquisition device) are necessary during this pass.

In the following it is assumed that n is a number of the acquisition devices and m is a number of the acquisition channels.

In an embodiment of the invention, position measurements for a first set of m acquisition devices are effected in a first step with the m acquisition channels. In a second step position measurements are implemented for a second set of again m acquisition devices, wherein the m acquisition channels are used. The first set is thereby not equal to the second set, which means that at least one acquisition device from the second set is not contained in the first set. The position of the respective acquisition devices is subsequently determined based on the implemented position measurements.

Because all available m acquisition channels are used in a step for position measurement, optimally many position measurements are advantageously implemented in this step. Moreover, since the second set is not equal to the first set, position measurements for up to 2*m different acquisition devices can be effected in the two steps.

In a further inventive embodiment position measurements are implemented in succession for a plurality of groups or sets of acquisition devices. Each set includes m acquisition devices and k is the number of the sets, when equation (1)

$$k = l * \mathrm{ceil}(n/m) \tag{1}$$

now applies (wherein l is a natural number), according to the invention at least l position measurements are implemented for each acquisition device, wherein the m acquisition channels are used to implement the position measurements for one of the k sets.

That smallest natural number which is greater than or equal to a parameter x (which is a rational number) is thereby returned or determined with the function ceil(x). It is thus exclusively rounded up, even when the first decimal place of x is smaller than 5.

The embodiment described above should be explained in the following by means of an example.

It is assumed that 9 acquisition devices and 3 acquisition channels exist and that position measurements are implemented for 12 sets of respectively 3 acquisition devices. In this case ceil(9/3)=3. l=4 thus results from the above equation (1), which means that given corresponding distribution of the 9 acquisition devices in the 12 sets a position measurement is implemented (at least) 4 times for each of the acquisition devices. One possible distribution of the 9 acquisition devices to the 12 sets is that a first through third acquisition device are distributed to a first, fourth, seventh and 10th set, a fourth through sixth acquisition device are distributed to a second, fifth, eighth and 11th set and a seventh through ninth acquisition device are distributed to a third, sixth, ninth and 12th set. Because a position measurement with the 3 acquisition channels is implemented for each of these 12 sets, it is ensured that a position measurement has been implemented 4 times for each of the 3 acquisition devices.

When only 8 acquisition devices exist in the above example instead of the 9 acquisition devices, ceil(8/3)=3, such that l=4 again results from the equation (1). It is clear that 9 acquisition devices can also be divided into twelve sets such that each acquisition device is contained at least 4 times in a set when this is already possible for 9 acquisition devices (as was shown in the preceding), such that for 8 acquisition devices it also applies that a position measurement can be implemented at least 4 times for each of the 8 acquisition devices.

According to a further inventive embodiment, the acquisition devices all move uniformly or continuously in the same direction. A position measurement for m of the acquisition devices is implemented with the m acquisition channels at a point in time after the acquisition debs have traveled a predetermined distance. At a point in time t+1 a position measurement is implemented for respectively different acquisition devices than at a point in time t, such that at least l position measurements have been implemented for each of the n acquisition devices after a specific number k of points in time, whereby the following equation (2) applies.

$$l = \text{floor}(k*m/n) \quad (2)$$

That largest natural number which is smaller than or equal to a parameter x (which is a rational number) is thereby returned or determined with the function floor(x). It is thus exclusively rounded down, even when the first decimal place of x is greater than 5.

This embodiment can be explained by means of an example. Assume that the number of the acquisition devices is 5, the number of the acquisition channels is 2 and the number of the points in time is 9. It then results from the equation (2) that l=3. It is thus possible that at least 3 position measurements have respectively been implemented for all 5 acquisition devices after 9 points in time between which the acquisition devices have respectively traveled a further predetermined distance (in total this predetermined distance was thus traveled 8 times, whereby the acquisition devices have always moved continuously in the same direction).

Naturally the acquisition devices could also inventively be moved in steps, whereby in principle arbitrarily many position measurements could be effected at rest at the end of a step, for example.

In a further embodiment it is assumed that a natural number f is determined via the following equation (3)

$$f = \text{ceil}(n/m) \quad (3)$$

According to the invention it is then also possible to divide the n acquisition devices up into a predetermined number of groups, wherein this predetermined number corresponds to the number f and every acquisition device is to be assigned to exactly one group. Each group thus has no more than m acquisition devices.

Since, according to the invention, each of these groups has at maximum as many acquisition devices as there are acquisition channels present, all acquisition devices of one of the groups can simultaneously be subjected to a position measurement. It is therefore possible in an advantageous manner for all acquisition devices to undergo a position measurement precisely once after f points in time in that a position measurement is implemented for a different group by means of the m acquisition channels at each point in time.

A special characteristic exists when the ratio n/m=f, which is the case when the ratio between the number of the acquisition devices and the acquisition channels yields an integer. In this case each of the f groups has precisely m acquisition devices.

Naturally it is also possible according to the invention that the position measurements (which are executed by, for example, two acquisition channels) do not occur simultaneously. For example, the position measurements implemented with the first channel could occur one, three, five, etc. seconds after a beginning of the continuous movement of the acquisition devices while the position measurements implemented with a second acquisition channel could respectively occur two, four, six etc. seconds after this movement beginning. This has the advantage, for example, that computers that are used to evaluate the position measurements could be assigned to the individual acquisition channels with a temporal offset, such that measurement results of an acquisition channel do not have to be buffered when the computer is directly occupied with the evaluation of the of the measurement results of another acquisition channel.

With the inventive method it is possible that at least one position measurement has been implemented for each of the n acquisition devices after ceil(n/m) points in time.

Because m acquisition devices which have previously not been subjected to any position measurement, are subjected to a position measurement at each ninth point in time, it can be ensured that a position measurement will have been implemented for each of the n acquisition devices after ceil(n/m) points in time, i.e. after optimally few points in time. In the event that the ratio n/m is not an integer, position measurements for acquisition devices for which a position measurement has already been implemented at a preceding point in time can be implemented at the last point in time (of the ceil(n/m) points in time), such that two position measurements can even be implemented for these acquisition devices.

In an embodiment, the acquisition devices are arranged on or at a patient support or on or at a patient who lies thereon, with the patient support being moved uniformly or continuously in one spatial direction. Because the acquisition devices are arranged on the patient support or on the patient, it is ensured that the distance between two of these acquisition devices essentially does not vary. After the patient support has traveled a specific distance, a position measurement for m acquisition devices can now be implemented with the m acquisition channels. Other acquisition devices are subjected to a position measurement after the patient support has traveled a specific distance, such that different acquisition devices are measured with regard to their position at a first specific point in time, than those measured at a further specific point in time, which lies immediately before the first specific point in time. It is therefore possible for all acquisition devices to have been subjected to at least one position measurement when the patient support has been moved exactly once through or into the magnetic resonance tomography scanner, such that each of the acquisition devices has entirely traversed the magnetic resonance tomography scanner or was at least slid sufficiently far into the scanner to implement position measurements.

The position of the acquisition devices can be determined by a magnetic field gradient aligned in one spatial direction being present at every position measurement and a frequency signal being emitted by the magnetic resonance tomography scanner. A signal profile for one of the acquisition devices for which the position measurement is implemented, is now measured with an acquisition channel along the magnetic field gradient. The position is subsequently determined for this corresponding acquisition device on the basis of one or more signal profile measurements.

In the event that the number of the acquisition devices is less than or equal to the number of the acquisition channels, each acquisition device can advantageously be continuously coupled with one acquisition channel.

In accordance with the present invention a control device is also provided for a magnetic resonance system for position determination in at least one spatial direction of acquisition devices. These acquisition devices thereby move relative to a magnetic resonance tomograph such that a position of the acquisition devices relative to one another or a distance between two acquisition devices remains constant. The control device has one or more acquisition channels and an evaluation device. In order to implement a position measurement with regard to one of the acquisition devices, the control device uses one of its acquisition channels. The control device is designed such that, in the event that the number of the acquisition devices exceeds the number of the acquisition channels, it implements a position determination with one of its acquisition channels for one of the acquisition devices and a position measurement is then implemented with the same acquisition channel for another of the acquisition devices. The position of the respective acquisition device is subsequently determined by the evaluation device.

The advantages of the inventive control device correspond to the advantages of the inventive method.

The above object is achieved in accordance with the present invention by a magnetic resonance system that includes the control device described above.

Moreover, the present invention includes a computer program product (in particular software) that can be loaded into a memory of a programmable controller of a magnetic resonance system. All embodiments of the inventive method described in the preceding can be executed with the program embodied this computer program product when the computer program product runs in the control device.

The present invention also encompasses an electronically-readable data medium (for example a DVD) on which electronically-readable control information (in particular software) is stored. All inventive embodiments of the method described in the preceding can be implemented when this control information is read from the data medium and stored in a controller of a magnetic resonance system.

The present invention is advantageously suited for a use in magnetic resonance systems in order to determine the position of acquisition devices, in particular local coils. However, the present invention is not limited to this preferred application, but rather can be used anywhere a current is induced in an acquisition device to be localized such that effects of this current can be detected.

The inventive principle can be applied to all position measurement methods in which, for position determination of at least two devices, a device must be connected with only one respective device to be measured during a position measurement.

DESCRIPTION OF THE PREFERRED EMBODIMENTS

Figure 1:
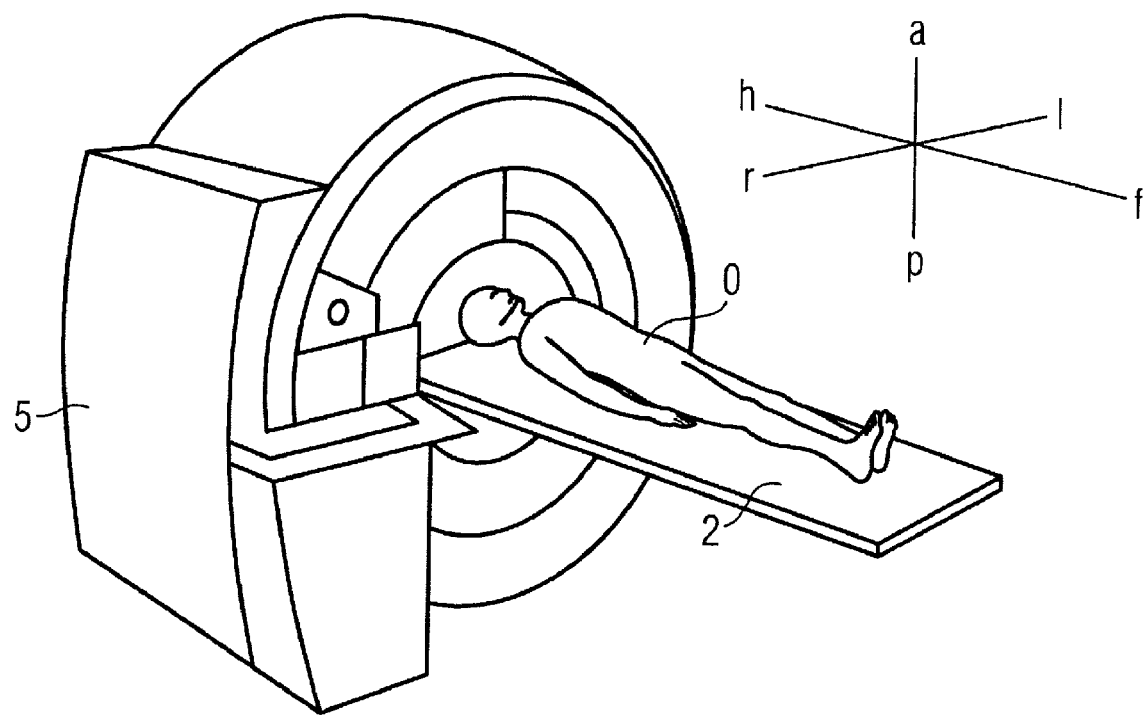
FIG. 1 is a schematic perspective depiction of a magnetic resonance system.

A magnetic resonance system 5 into which a patient O who lies on a patient support 2 is inserted is shown in FIG. 1 in an overview.

Figure 2:
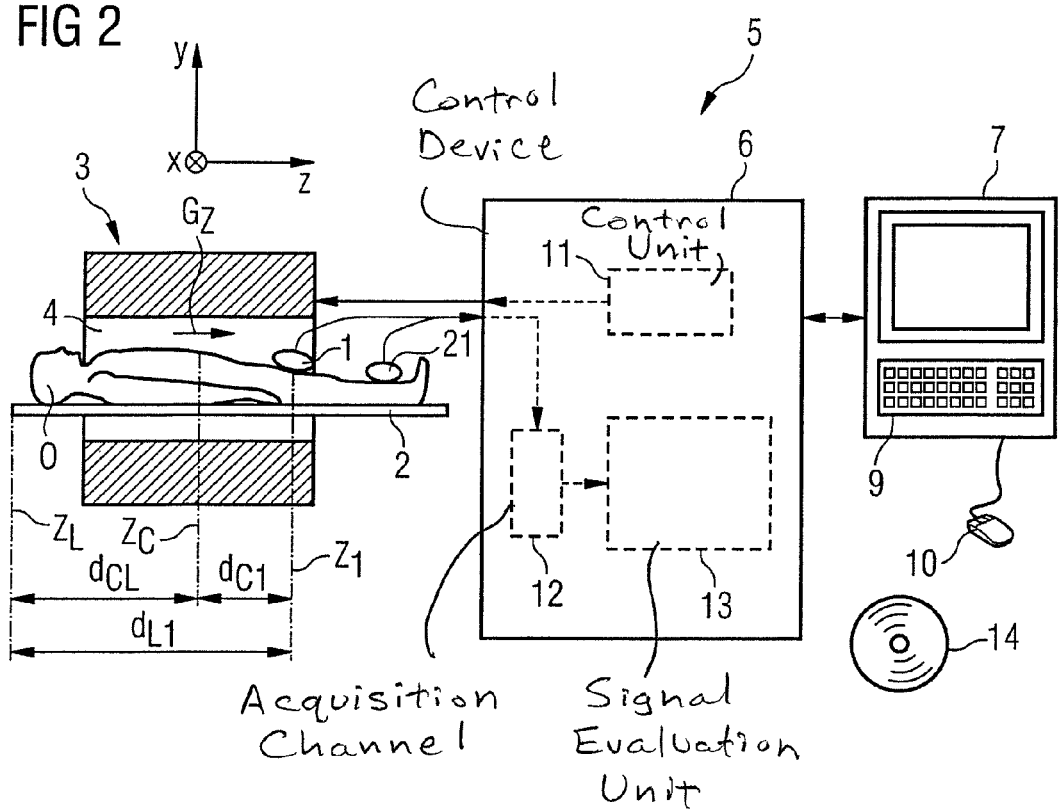
FIG. 2 is a schematic depiction of an inventive magnetic resonance system.

FIG. 2 shows an exemplary embodiment for the magnetic resonance system 5 in which an automatic determination of the position of two local coils 1, 21 is possible according to the inventive method. The core of this magnetic resonance system 5 is a scanner 3 in which a patient O is positioned on a patient support 2 in an annular basic field magnet (not shown) which encloses a measurement space 4.

The patient support 2 can be displaced in the longitudinal direction, i.e. along the longitudinal axis of the scanner 3. This direction is designated as the z-direction in a spatial coordinate system (likewise shown). A whole-body coil (not shown) with which radio-frequency pulses can be emitted and acquired is located within the basic field magnet in the scanner 3. Moreover, the scanner 3 includes typical gradient coils (not shown) in order to be able to apply a magnetic field gradient in each of the spatial directions x, y, z.

The scanner 3 is controlled by a control device 6 which here is shown separate from the scanner 3. A terminal 7 which comprises a screen 8, a keyboard 9 and a mouse 10 is connected to the control device 6. The terminal 7 in particular serves as a user interface with which an operator operates the control device 6 and therewith the scanner 3. Both the control device 6 and the terminal 7 are components of the magnetic resonance system 5.

Moreover, a DVD 14 is shown in FIG. 2, on which DVD 14 is stored software with which the inventive method can be executed when the software has been loaded into the control device 6.

The magnetic resonance system can furthermore have all further typical components or features such as interfaces for connection of a communication network, for example an image information system or the like. All of these components are known and thus not shown in FIG. 2 for better clarity.

An operator can communicate with the control device 6 via the terminal 7 and thus arrange for an implementation of desired measurements in that, for example, the scanner 3 is controlled by the control device 6 such that the required radio-frequency pulse sequences are emitted by the antenna and the gradient coils are switched in a suitable manner. Raw image data arriving from the scanner 3 are also acquired via the control device 6 and converted into corresponding images in a signal evaluation unit (not shown) which can be, for example, a module of the control device 6. These images are then displayed (for example on the screen 8) and/or stored in a memory or, respectively, sent via a network.

The control device 6 entirely automatically determines a position $z_1$ of the local coil 1 in that it determines this position $z_1$ in the z-direction with the help of the inventive method. The determined position $z_1$ can refer to a position $z_L$ of a fixed point on the patient support 2 which is arranged on a head-side front end of the patient support 2. This fixed point can thus form an origin for a patient support coordinate system which moves as well given a movement of the patient support 2. The position $z_1$ of the local coil 1 in the patient support coordinate system can then be determined as a distance $d_1$ to this fixed point.

The patient support 2 can be moved in a motorized manner in the z-direction within the scanner 3 by means of the control device 6. The control device 6 has a control unit 11 which automatically drives the patient support 2 through the scanner 3 or occupies various positions within the scanner 3. Moreover, the control device 6 provides that a defined magnetic field gradient $G_Z$ is applied in the z-direction and that a radio-frequency signal which essentially corresponds to the magnetic resonance frequency is simultaneously emitted by the whole-body coil.

An acquisition signal profile $SP_1$, in the z-direction (i.e. in the direction of the magnetic field gradient $G_Z$) is then alternately measured and acquired with the local coil 1 and the local coil 21 with an acquisition channel 12 or a measurement device of the control device 6. Such a signal profile is acquired for a plurality of positions of the patient support 2 within the scanner 3 for the local coil 1 and for the local coil 21. The patient support 2 is thereby moved continuously, wherein a signal profile for the local coil 1 and for the local coil 21 is respectively acquired in alternation at a plurality of points lying close to one another.

This procedure should be explained in detail in the following.

Figure 3:
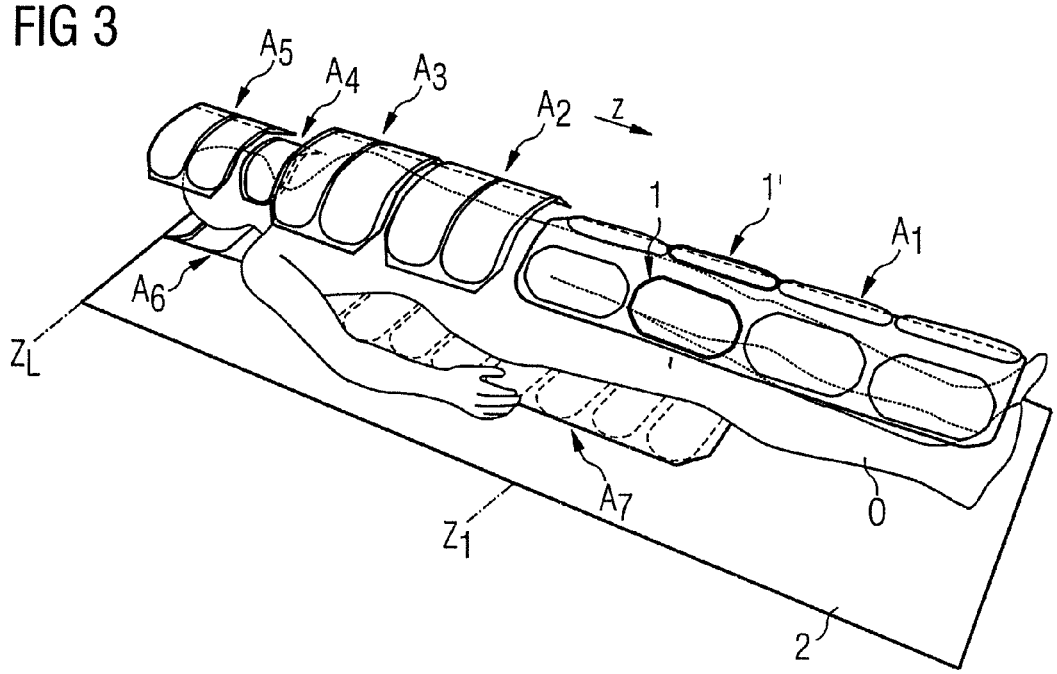
FIG. 3 is a perspective schematic depiction of a patient borne on a patient support with a number of local coils and local coil arrays.

FIG. 3 shows a patient O on the patient support 2, wherein a plurality of local coils 1, 1' or local coil arrays $A_1, A_2, A_3, A_4, A_5, A_6, A_7$ are arranged both below the patient O and on the patient. Such a local coil array normally comprises a plurality of individual local coils. In the shown case a large local coil array $A_7$ with eight individual local coils lies below the patient O from the spinal column region to the knee region.

In the following the positions of the two local coils 1, 1' located at the knees of the patient O (within the local coil array $A_1$) should now be determined. It initially concerns determining the position $z_1$ in the z-direction relative to the position $Z_L$ of the head end of the patient support 2, i.e. relative to the origin of the patient support coordinate system. The selection of this origin $Z_L$ at the head end of the patient support 2 is naturally arbitrary, and in principle it is possible to determine the position of the two local coils 1, 1' in any other arbitrary coordinate system, for example with an origin at the feet end or in the middle of the patient support 2.

Since both the coordinates of the patient support 2 and the coordinates of the scanner 3 are known at each position of the patient support 2 relative to the scanner 3, the relative position $z_1$ of the local coils 1, 1' on the patient support 2 can also be determined without further measures in a position of the local coils 1, 1' relative to a fixed point of the tomograph, for example at a position $Z_C$ of a center of the tomograph. This is apparent from FIG. 2. The position $Z_L$ of the head end of the patient support 2 relative to the center of the scanner 3 (i.e. the distance $d_{CL}$) is known. The position $z_1$ of the local coil 1 (and of the local coil 1') relative to the head end of the patient support 2, i.e. the distance $d_{L1}$ of the local coil 1, 1' to the head end, is determined with the aid of the inventive method. The distance $d_{C1}$ between the local coil 1 and the center of the scanner 3, which ultimately corresponds to the position of the local coil 1, 1' relative to the center of the scanner 3, automatically results via the difference $(d_{L1}-d_{CL})$ of these two distances $d_{L1}, d_{CL}$.

Figure 4:
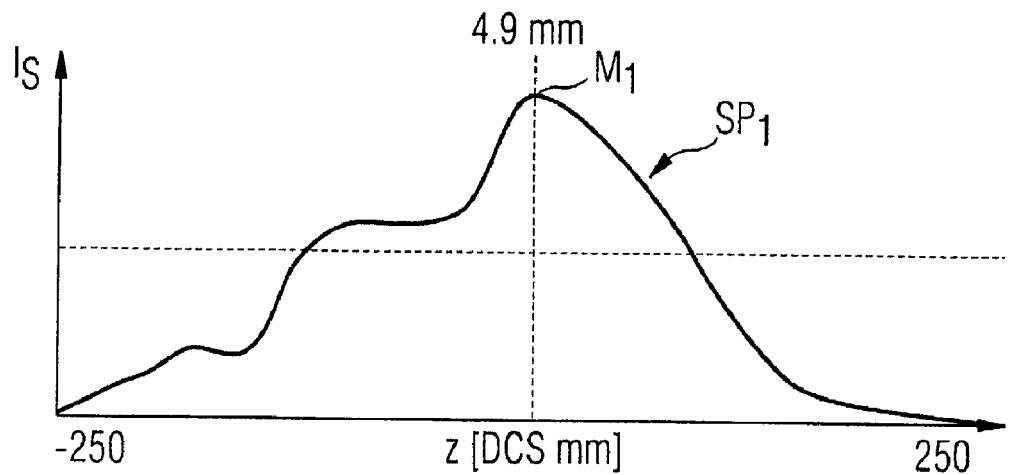
FIG. 4 is a depiction of an inventively determined signal profile of a local coil located at a specific position on the patient support.

FIG. 4 depicts a signal profile $SP_1$ which was acquired by the local coil 1. A signal intensity $I_S$ is thereby plotted over the z-position relative to the center of the scanner 3. In the measurement of this signal profile $SP_1$ the patient support 2 was located in a position in which the local coil 1 was located approximately in the middle (i.e. in the center) of the scanner 3. The "dented" shape of the signal profile $SP_1$ results in that the local coil 1 lies on a patient O and is thus located over an anatomical region with changing load situation.

A maximum $M_1$ can be determined relatively simply from the signal profile $SP_1$ shown in FIG. 4, from which maximum $M_1$ the position of the local coil 1 can finally be determined. However, in order to make the determination of the position not dependent on only one position measurement a plurality of position measurements are implemented for each local coil 1, 1'. The signal profiles of such measurements (not shown) resemble the signal profile $SP_1$ as long as the local coil 1 is clearly located within the scanner 3, with the exception that the signal profile is displaced corresponding to the relative position of the measured local coil. It is taken into account that the signal profile changes more significantly the closer that the corresponding local coil 1, 1' approaches the edge of the scanner 3 or, respectively, the more that the local coil 1, 1' moves out of the scanner 3. However, it is extremely difficult to draw a line as of which a measured signal profile $SP_1$ is still acceptable (i.e. delivers a reasonable position determination) and as of which it no longer does this.

One possible solution to this problem is to move the patient support 2 through the scanner 3 such that each local coil 1, 1' completely traverses the scanner 3 or at least arrives sufficiently far in the scanner 3, wherein during this run of the patient support 2 a plurality of position measurements is implemented for each local coil 1, 1'. The patient support 2 can frequently not completely traverse the scanner 3; rather, it is designed such that (for example) the foot region of the patient support 2 can only move up to the center of the scanner 3. It is advantageous that sufficiently many position measurements in order to be able to implement a sufficiently precise position determination for these local coils are implemented in the single run of the patient support 2 even for local coils which are located in the foot region of the patient support 2.

When these position measurements are graphically plotted (wherein a distance from one fixed point of the patient support 2 to a fixed point of the scanner 3, for example the distance $d_{CL}$ described above, is plotted on the x-axis and the z-position (the maximum of $I_S$) of the measured local coil derived from the respectively measured signal profile is plotted on a y-axis) a distinctly straight path results over that region in which the acquired signal profiles allow a reasonable position determination. If a position measurement is now picked out in the middle of this region or in the middle of this path, it is ensured that a z-position derived from this position measurement very precisely reproduces the real z-position of the corresponding local coil.

Figure 5:
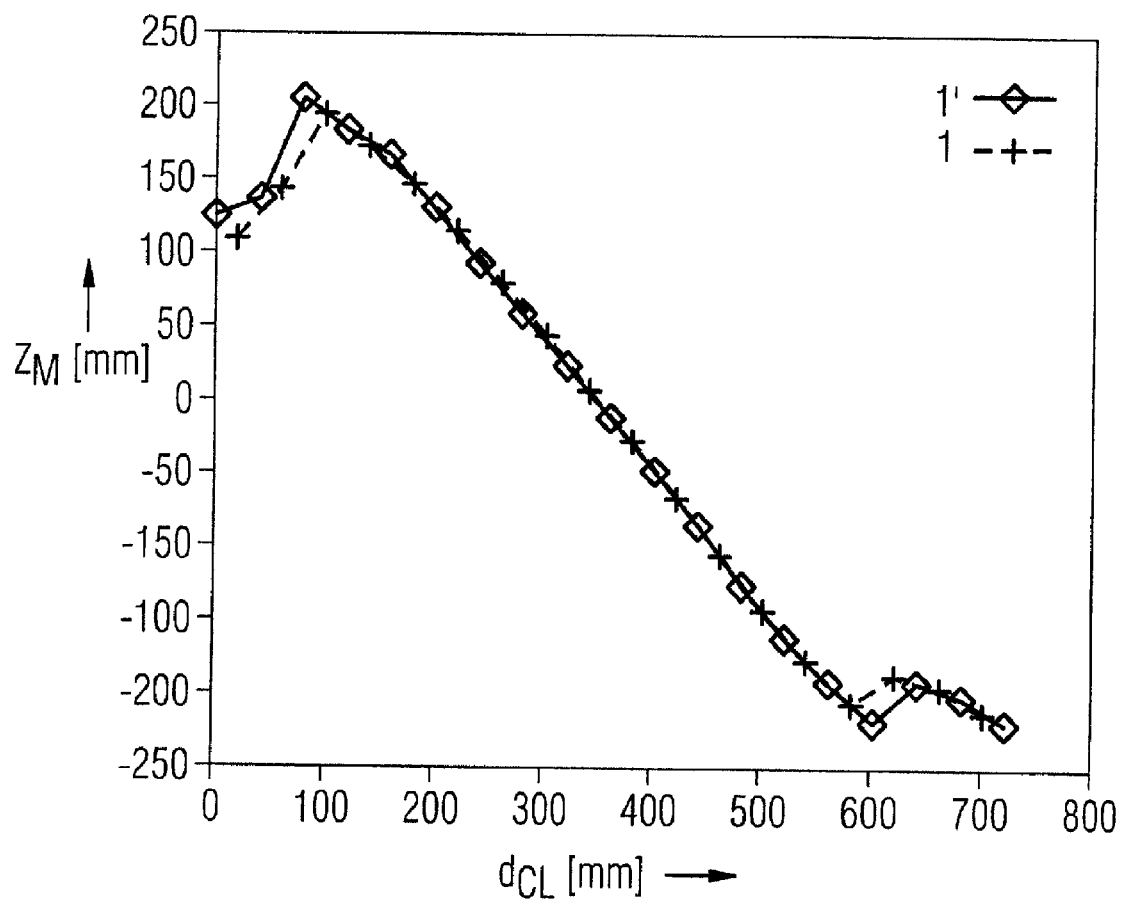
FIG. 5 shows two measurement curves for two local coils located next to one another at the same z-position.

FIG. 5 shows how the positions of two local coils 1, 1' are determined with only one acquisition channel 12 given only one run of the patient support 2 through the scanner 3. The patient support 2 was thereby moved in the direction of the head during the measurement. In FIG. 5 the position of the patient support 2 at which the corresponding position measurement was effected (i.e. here the position $Z_L$ of the head end of the patient support 2 relative to the center of the scanner 3 or the distance $d_{CL}$) is plotted on the x-axis. The z-position of the local coil 1 or local coil 1' determined from each position measurement is plotted on the y-axis. In this example the position value $Z_L$ is thereby plotted relative to the first measurement of this experiment on the x-axis. A value range from 0 to just under 800 mm results from this. If the patient support 2 were passed through over its entire length, a measure of approximately 2000 mm would result. Since the position of the patient support 2 is, however, known anyway in every measurement, the relative positions can be translated among one another without further measures.

In the experiment which led to the results shown in FIG. 5 a position measurement was conducted every 20 mm. A position measurement with regard to the local coil 1 and a position measurement with regard to the local coil 1' were thereby implemented in alternation. In other words, the acquisition channel 12 was connected with the left local coil 1' in the first (third, fifth, etc.) measurement and with the right local coil 1 in the second (fourth, sixth, etc.) measurement. The focal point or the position $Z_M$ of the focal point of the signal profile $I_S$ of the left local coil 1' or of the right local coil 1 that is measured in each measurement is then plotted on the y-axis corresponding to the distance $d_{CL}$ present in the measurement.

The measurement curve depicted in FIG. 5 directly shows a straight region of a constant slope in a range from approximately 100 mm to 600 mm, which here lies approximately at −1 due to the identical units on the x-axis and y-axis. In this range, in particular in the middle of this range, the position of the local coils 1, 1' can be reliably inferred. Since this straight range clearly exhibits over 10 measurement points both for the left local coil 1' and for the right local coil 1, the position of both the left local coil 1' and the right local coil 1 can be determined extremely precisely, even when a position measurement is implemented for each local coil 1, 1' only given every second feed by 20 mm since the acquisition channel 12 is alternately used for the left local coil 1' and for the right local coil 1.

Figure 6:
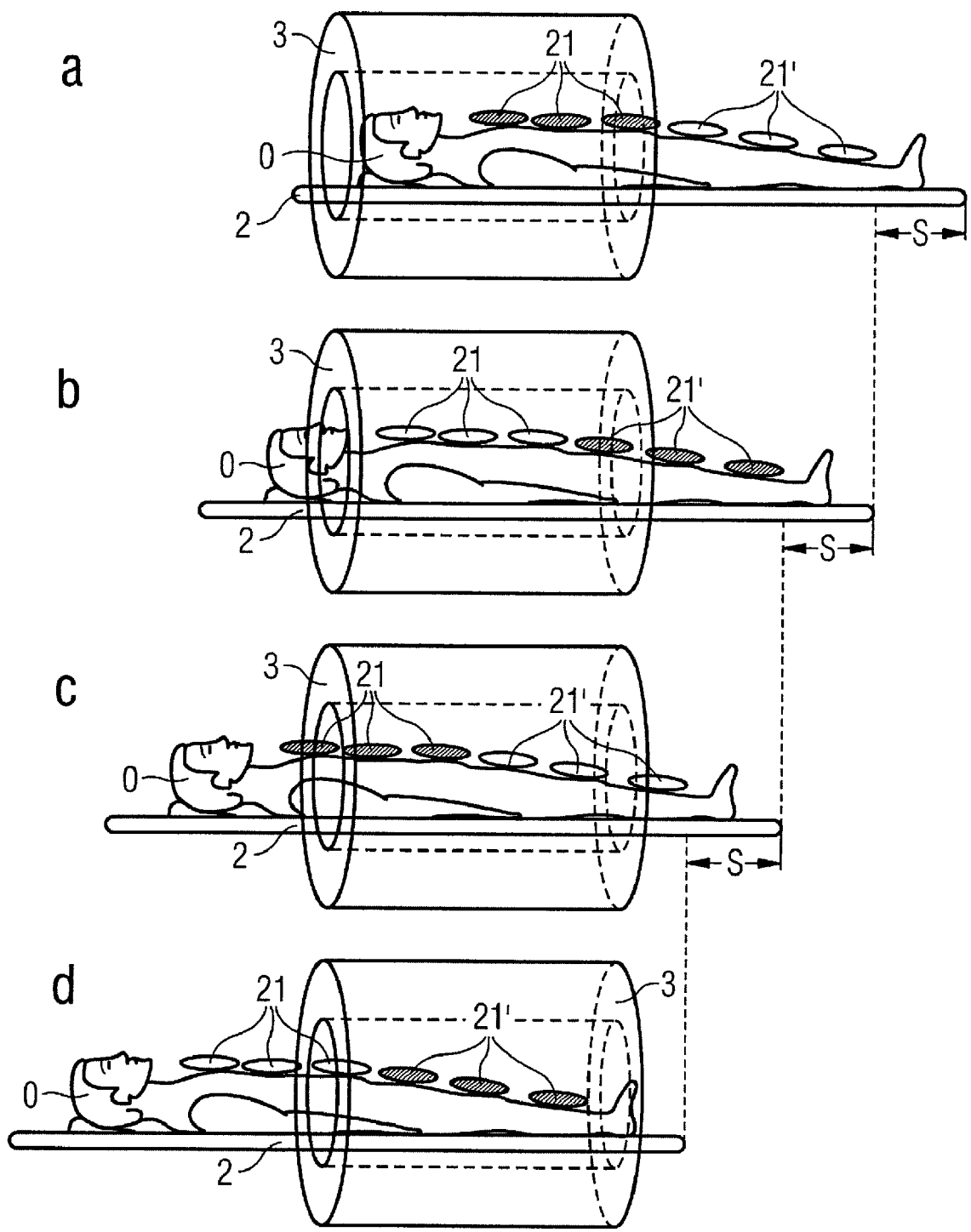
FIG. 6 in which it is shown how a patient support with a patient supported thereon with a number of local coils is moved through a magnetic resonance tomography scanner.

A further example for application of the inventive method is presented in FIG. 6. In the embodiment shown in FIG. 6 the positions of six local coils 21, 21' are determined with three acquisition channels 12 in that the local coils 21, 21' are moved once through the scanner 3. The six local coils 21, 21' are thereby divided into two groups, namely the first (as viewed from the head side of the patient O on whom the local coils 21, 21' rest) three local coils 21 in a first group and the second three local coils 21 in a second group. The local coils 21 of the first group and the local coils 21 of the second group are now alternately connected with the three acquisition channels 12 in order to respectively implement one position measurement per connected local coil 21, 21'. In FIG. 6a the three local coils 21 of the first group are connected with the three acquisition channels 12 and a position measurement is respectively implemented for the three local coils 21 of the first group. In FIG. 6b the three local coils 21 of the second group are connected with the three acquisition channels 12 and one position measurement is respectively implemented per local coil 21' after the patient support 2 (and therewith the local coils 21, 21') have been moved forward by a length s. It is noted that in FIG. 6 those local coils 21, 21' for which a position measurement is implemented (thus which are connected with the three acquisition channels 12) are respectively designated in black. In FIG. 6c the patient support 2 (and therewith the local coils 21, 21') is moved forward by a further length s and the local coils 21 of the first group have again been connected with the acquisition channels 12, such that a position measurement is implemented for the local coils 21. In FIG. 6d the patient support 2 has in turn been moved forward by a further length s and the local coils 21' of the second group are connected with the three acquisition channels 12 such that a position measurement is implemented for these local coils 21'.

The inventive method in FIG. 6 has been described with an example of only four measurement positions in total, such that only two position measurements are respectively implemented per local coil 21, 21'. Naturally, many more position measurements are implemented in total and per local coil 21, 21', as is shown in FIG. 5 for example.

An important feature of the present invention is in the reduction of the individual position measurements per local coil 1, 1', 21, 21' given a table movement, so an interleaving of a number of position measurements or magnetic resonance sub-acquisitions per coil position determination is possible for various subsets of local coils.

An important advantage of the present invention is that all local coils 1, 1', 21, 21' can be detected with only a single table movement, even when fewer acquisition channels 12 than local coils are available. A time savings (for example relative to methods which operate with a number of table movements) and a lesser global system complexity result, since known measurement methods are inventively employed in an interleaved manner.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for automatically determining respective positions in at least one spatial direction of magnetic resonance signal acquisition devices in a magnetic resonance tomography scanner, said magnetic resonance tomography scanner comprising only a number of acquisition channels, said method comprising the steps of:

placing a plurality of magnetic resonance signal acquisition devices, respectively at substantially unchanging positions relative to each other, at a patient on a patient support table, each of said plurality of acquisition devices requiring connection to an acquisition channel, in said number of acquisition channels, for acquisition of a magnetic resonance signal therewith, said number of acquisition channels being less than said plurality of signal acquisition devices;

moving said patient support table with said patient and said signal acquisition devices thereon through said magnetic resonance tomography scanner in a single pass-through said magnetic resonance tomography scanner;

during said single pass of said patient support table through said magnetic resonance tomography scanner, automatically operating said scanner, from a control unit connected thereto, to make a first position measurement for a first subset of the plurality of acquisition devices using a first subset of said number of acquisition channels, and automatically operating said scanner from said control unit to make a second position measurement for a second subset, that is different from said first subset, of the plurality of acquisition devices using a second subset of said number of acquisition channels; and in a processor, automatically determining the respective positions of each acquisition device in each of said first and second subsets of acquisition devices from said first and second position measurements.

2. A method as claimed in claim 1 wherein said first subset of said number of acquisition channels is the same as said second subset of said number of acquisition channels.

3. A method as claimed in claim 1 comprising making said second position measurement immediately following said first position measurement.

4. A method as claimed in claim 1 comprising providing n acquisition devices and m acquisition channels, and comprising:

making said first and second position measurements for a first subset of m acquisition devices and first and second position measurements for a second subset of m acquisition devices using the same subset of said number of acquisition channels, and selecting said second set of m acquisition devices not equal to said first set of m acquisition devices; and automatically determining the respective positions of the acquisition devices in each of said first and second subset from said first and second position measurements.

5. A method as claimed in claim 4 comprising making said first and second position measurements in succession using said same acquisition channel or channels for a third plurality k of sets of m acquisition devices so that when k=l·ceil (n/m), wherein l is a natural number, at least l position measurements have been implemented for each acquisition device, and automatically determining the respective positions of the acquisition devices in all subsets from the l position measurements for each acquisition device.

6. A method as claimed in claim 5 wherein all of said acquisition devices move uniformly in a same direction relative to said magnetic resonance tomography scanner, and comprising:

making said position measurement for m of the acquisition devices with said same acquisition channel or channels at a point in time after said m of said acquisition devices have moved a predetermined distance, and making said second position measurement for others of said acquisition devices at each point in time, thereby implementing a fourth plurality l of position measurements for each acquisition device after a third plurality k points in time, with l=floor (k·m/n).

7. A method as claimed in claim 6 wherein l>2.

8. A method as claimed in claim 4 comprising:

dividing said acquisition devices into a plurality of f groups, each group comprising at most m acquisition devices, wherein said f=ceil(n/m); and implementing a position measurement at least once for each of the acquisition devices in the respective f groups when each acquisition device in that group is coupled with an acquisition channel.

9. A method as claimed in claim 4 comprising simultaneously implementing m position measurements at one point in time.

10. A method as claimed in claim 9 comprising implementing at least one position measurement for each acquisition device after ceil(n/m) points in time.

11. A method as claimed in claim 4 comprising;

distributing said acquisition devices along a longitudinal length of a patient support and moving said patient support through said magnetic resonance tomography scanner in said spatial direction;

implementing a position measurement for m acquisition devices with said acquisition channel or channels at a point in time after said patient support has moved a predetermined distance;

implementing a position measurement for different acquisition devices at each point in time and, after movement of the patient support, automatically determining the respective positions of the acquisition devices during said movement.

12. A method as claimed in claim 1 comprising:

for each position measurement, emitting a radio-frequency signal in a magnetic field gradient applied in a spatial direction and detecting a signal profile with the same acquisition device with said same acquisition channel; and determining the respective positions of the acquisition devices from a plurality of said signal profiles respectively obtained with the respective acquisition devices.

13. A method as claimed in claim 1 comprising employing a magnetic resonance local coil as at least one of said acquisition devices.

14. A method as claimed in claim 1 comprising coupling each acquisition device with an individual acquisition channel if a number of said acquisition devices is less than or equal to a number of said acquisition channels.

15. A control device that automatically determines respective positions in at least one spatial direction of a plurality of magnetic resonance signal acquisition devices in a magnetic resonance tomography scanner, said magnetic resonance tomography scanner comprising only a number of acquisition channels, said plurality of magnetic resonance signal acquisition devices being placed respectively at substantially unchanging positions relative to each other at a patient on a patient support table, each of said plurality of acquisition devices requiring connection to an acquisition channel, in said number of acquisition channels, for acquisition of a magnetic resonance signal therewith, said number of acquisition channels being less than said plurality of signal acquisition devices, said control device comprising:

a scanner and table control unit configured to operate said patient support table and said scanner by moving said patient support table with said patient and said signal acquisition devices thereon through said magnetic resonance tomography scanner in a single pass-through said magnetic resonance tomography scanner and, during said single pass of said patient support table through said magnetic resonance tomography scanner, by automatically operating said scanner, from a control unit connected thereto, to make a first position measurement for a first subset of the plurality of acquisition devices using a first subset of said number of acquisition channels, and automatically operating said scanner from said control unit to make a second position measurement for a second subset, that is different from said first subset, of the plurality of acquisition devices using a second subset of said number of acquisition channels; and a processor configured to automatically determine the respective positions of each acquisition device in each of said first and second subsets of acquisition devices from said first and second position measurements.

16. A control device as claimed in claim 15 wherein said first subset of said number of acquisition channels is the same as said second subset of said number of acquisition channels.

17. A control device as claimed in claim 15 that makes said second position measurement immediately following said first position measurement.

18. A control device as claimed in claim 15 wherein said magnetic resonance tomography scanner has n acquisition devices and m acquisition channels, and wherein said control device makes said first and second position measurements for a first set of m acquisition devices and first and second position measurements for a second set of m acquisition devices using a same channel or channels, and selecting said second set of m acquisition devices not equal to said first set of m acquisition devices, and automatically determines the respective positions of the acquisition devices in each of said first and second sets from said first and second position measurements.

19. A control device as claimed in claim 18 that makes said first and second position measurements in succession using said same acquisition channel or channels for a third plurality k of sets of m acquisition devices so that when k=l·ceil (n/m), wherein l is a natural number, at least l position measurements have been implemented for each acquisition device, and automatically determining the respective positions of the acquisition devices in all sets from the l position measurements for each acquisition device.

20. A control device as claimed in claim 19 wherein all of said acquisition devices move uniformly in a same direction relative to said magnetic resonance tomography scanner, and wherein said control device makes said position measurement for m of the acquisition devices with said same acquisition channel or channels at a point in time after said m of said acquisition devices have moved a predetermined distance, and makes said second position measurement for others of said acquisition devices at each point in time, thereby implementing a fourth plurality l of position measurements for each acquisition device after a third plurality k points in time, with l=floor (k·m/n).

21. A control device as claimed in claim 20 wherein l>2.

22. A control device as claimed in claim 18 that divides said acquisition devices into a plurality of f groups, each group comprising at most m acquisition devices, wherein said f=ceil (n/m), and implements a position measurement at least once for each of the acquisition devices in the respective f groups when each acquisition device in that group is coupled with an acquisition channel.

23. A control device as claimed in claim 18 that simultaneously implements m position measurements at one point in time.

24. A control device as claimed in claim 23 that implements at least one position measurement for each acquisition device after ceil(n/m) points in time.

25. A control device as claimed in claim 18 wherein said acquisition devices are distributed along a longitudinal length of a patient support and moving said patient support through said magnetic resonance tomography scanner in said spatial direction, and wherein said control device implements a position measurement for m acquisition devices with said acquisition channel or channels at a point in time after said patient support has moved a predetermined distance, and implements a position measurement for different acquisition devices at each point in time and, after movement of the patient support, automatically determines the respective positions of the acquisition devices during said movement.

26. A control device as claimed in claim 15 that, for each position measurement, causes a radio-frequency signal to be emitted in a magnetic field gradient applied in a spatial direction and a signal profile to be detected with that acquisition device with said same acquisition channel, and determining the respective positions of the acquisition devices from a plurality of said signal profiles respectively obtained with the respective acquisition devices.

27. A control device as claimed in claim 15 that operates a magnetic resonance local coil as at least one of said acquisition devices.

28. A control device as claimed in claim 15 wherein each acquisition device is coupled with an individual acquisition channel if a number of said acquisition devices is less than or equal to a number of said acquisition channels.

29. A magnetic resonance system comprising:
a magnetic resonance tomography scanner, said magnetic resonance tomography scanner comprising only a number of acquisition channels;
a plurality of magnetic resonance signal acquisition devices, respectively placed at substantially unchanging positions relative to each other, on a patient support table, each of said plurality of acquisition devices requiring connection to an acquisition channel, in said number of acquisition channels, for acquisition of a magnetic resonance signal therewith, said number of acquisition channels being less than said plurality of signal acquisition devices;
a control unit configured to move said patient support table with said patient and said signal acquisition devices thereon through said magnetic resonance tomography scanner in a single pass-through said magnetic resonance tomography scanner;
said control unit being configured to automatically operate said scanner during said single pass of said patient support table through said magnetic resonance tomography scanner to make a first position measurement for a first subset of the plurality of acquisition devices using a first subset of said number of acquisition channels, and to automatically operate said scanner to make a second position measurement for a second subset, that is different from said first subset, of the plurality of acquisition devices using a second subset of said number of acquisition channels; and
a processor configured to automatically determine the respective positions of each acquisition device in each of said first and second subsets of acquisition devices from said first and second position measurements.

30. A magnetic resonance system as claimed in claim 29 wherein said first subset of said number of acquisition channels is the same as said second subset of said number of acquisition channels.

31. A non-transitory computer-readable storage medium encoded with programming instructions for automatically determining respective positions in at least one spatial direction of magnetic resonance signal acquisition devices in a magnetic resonance tomography scanner, said magnetic resonance tomography scanner comprising only a number of acquisition channels, and a plurality of magnetic resonance signal acquisition devices, placed respectively at substantially unchanging positions relative to each other, on a patient support table, each of said plurality of acquisition devices requiring connection to an acquisition channel, in said number of acquisition channels, for acquisition of a magnetic resonance signal therewith, said number of acquisition channels being less than said plurality of signal acquisition devices, and comprising a computerized control and evaluation system in which said storage medium is loaded, said programming instructions causing said computerized control and evaluation system to:

move said patient support table with said patient and said signal acquisition devices thereon through said magnetic resonance tomography scanner in a single pass-through said magnetic resonance tomography scanner;

during said single pass of said patient support table through said magnetic resonance tomography scanner, automatically operate said scanner to make a first position measurement for a first subset of the plurality of acquisition devices using a first subset of said number of acquisition channels, and automatically operate said scanner to make a second position measurement for a second subset, that is different from said first subset, of the plurality of acquisition devices using a second subset of said number of acquisition channels; and automatically determine the respective positions of each acquisition device in each of said first and second subsets of acquisition devices from said first and second position measurements.

32. A storage medium as claimed in claim 31 wherein said first subset of said number of acquisition channels is the same as said second subset of said number of acquisition channels.

* * * * *